(12) United States Patent
Schoch

(10) Patent No.: US 7,082,546 B2
(45) Date of Patent: Jul. 25, 2006

(54) LOW-SPEED DLL EMPLOYING A DIGITAL PHASE INTERPOLATOR BASED UPON A HIGH-SPEED CLOCK

(75) Inventor: Daniel Schoch, Costa Mesa, CA (US)

(73) Assignee: Broadcom Corporation, Irvine, CA (US)

( * ) Notice: Subject to any disclaimer, the term of this patent is extended or adjusted under 35 U.S.C. 154(b) by 517 days.

(21) Appl. No.: 10/309,930

(22) Filed: Dec. 4, 2002

(65) Prior Publication Data

US 2004/0027158 A1    Feb. 12, 2004

Related U.S. Application Data

(60) Provisional application No. 60/403,455, filed on Aug. 12, 2002, provisional application No. 60/403,456, filed on Aug. 12, 2002, provisional application No. 60/403,457, filed on Aug. 12, 2002.

(51) Int. Cl.
*G06F 1/04* (2006.01)
*G06F 1/06* (2006.01)
*G06F 1/12* (2006.01)

(52) U.S. Cl. .................. 713/500; 713/501; 713/600
(58) Field of Classification Search ................ 713/500, 713/501
See application file for complete search history.

(56) References Cited

U.S. PATENT DOCUMENTS 6,157,231 A * 12/2000 Wasson ...................... 327/156
6,724,850 B1 * 4/2004 Hartwell ..................... 375/376

* cited by examiner

*Primary Examiner*—Lynne H. Browne
*Assistant Examiner*—Stefan Stoynov
(74) *Attorney, Agent, or Firm*—Garlick Harrison & Markison

(57) ABSTRACT

A low-speed DLL facilitates a deskewed interface between a high-speed RX data demultiplexer circuit directly to an Application Specific Integrated Circuit (ASIC) with which it is integrated by locking a 156 MHz ASIC clock to a 156 MHz reference derived from a high speed 2.5 GHz clock. The DLL employs a digital interpolator to generate 32 phases of the 156 MHz clock. The digital interpolator supplies the phases using a double clocked shift register with recirculating feedback. The shift register is double clocked using the 2.5 GHz clock. The register outputs are tapped and fed to a 32:1 multiplexer having a phase select input that is controlled by the phase difference signal generated by the DLL. The phase difference control signal is converted to a digital representation of its magnitude by which the requisite number of phase shift increments may be selected. The phase chosen is that which eliminates any difference in the phases of the 156 MHz clock that clocks the data transmitted to the ASIC domain and the clock that is used in the ASIC domain to latch the data. Thus, the interpolator takes advantage of the availability of the high-speed clock to generate a sufficient number of phases for a low speed DLL.

13 Claims, 8 Drawing Sheets

LOW-SPEED DLL EMPLOYING A DIGITAL PHASE INTERPOLATOR BASED UPON A HIGH-SPEED CLOCK

CROSS REFERENCES TO RELATED APPLICATIONS

The present application claims priority under 35 U.S.C. 119(e) to the following applications, each of which is incorporated herein for all purposes:

(1) provisional patent application having an application number No. 60/403,455, and a filing date of Aug. 12, 2002;

(2) provisional patent application having an application number No. 60/403,456, and a filing date of Aug. 12, 2002; and (3) provisional patent application having an application number No. 60/403,457 and a filing date of Aug. 12, 2002.

BACKGROUND OF THE INVENTION

1. Technical Field of the Invention

The present invention relates generally to communication systems, and more particularly to high-speed serial bit stream communications.

2. Description of Related Art

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure. The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) mounted upon the PCBs of the housing. These ASICs perform switching operations for the data that is received on the coupled media and transmitted on the coupled media. The coupled media typically terminates in a receptacle and transceiver circuitry coupled thereto performs signal conversion operations. In most installations, the media (e.g. optical media), operates in a simplex fashion. In such case, one optical media carries incoming data (RX data) to the PCB while another optical media carries outgoing data (TX data) from the PCB. Thus, the transceiver circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiver circuit that resides between the physical media and the ASIC must satisfy all of these requirements.

Various standardized interfaces have been employed to couple the transceiver circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Particular difficulties arise in converting data between the 40×1 GBPS line interface and the 16×2.5 GBPS communication ASIC interface. In particular, operation on the 40 GBPS side requires the ability to switch data at a very high bit rate, e.g., exceeding the bit rate possible with a CMOS integrated circuit formed of Silicon. While other materials, e.g., Indium-Phosphate and Silicon-Germanium provide higher switching rates than do Silicon based devices, they are very expensive and difficult to manufacture. Further, the functional requirements of interfacing the 40×1 GBPS line interface and the 16×2.5 GBPS communication ASIC interface are substantial. Thus, even if a device were manufactured that could perform such interfacing operations, the effective yield in an Indium-Phosphate or Silicon-Germanium process would be very low.

Given the drive to achieve greater and greater levels of integration, it would be desirable to integrate at least the silicon portion of the transceiver circuit within the ASIC circuit itself. This would eliminate the standard interface between the ASIC and the transceiver circuit, as well as the need for PC board interconnect lines between the ASIC and the transceiver circuit. This would require the transceiver circuit to operate at a first clock frequency domain to interface with the data being received at the 40×1 GBPS line interface, while the ASIC runs at a second clock frequency domain which is several times lower.

For the transceiver circuit to communicate effectively with the ASIC, notwithstanding that they are running at significantly different clock speeds, typically a circuit such as a DLL is employed to lock the two clocks together in phase such that the ASIC clock is capable of capturing data transmitted to it from the transceiver circuit. To adjust the phase to eliminate any skew between the two clocks, a phase interpolator is often used in the DLL to provide the necessary phase adjustment. Phase interpolators, however, can be complex, dissipate large amounts of power and be somewhat difficult to program.

Thus, there is a need in the art for a simpler, lower power interpolator solution that is capable of providing fine degradations of phase for controlling the lock between a high-speed and low-speed line interface. There is also a need to lock two low speed clocks using a high-speed clock to eliminate skew between the low-speed clocks.

SUMMARY OF THE INVENTION

In order to overcome the above-described shortcomings, as well as other shortcomings of the prior devices, a low-speed Delay Locked Loop (DLL) facilitates a deskewed interface between a high-speed RX data demultiplexer circuit directly to an Application Specific Integrated Circuit (ASIC). Such result is obtained by locking a 156 MHz ASIC clock to a 156 MHz reference derived from a high speed 2.5 GHz clock of the high-speed RX data demultiplexer circuit. The DLL employs a digital interpolator to generate 32 phases of the 156 MHz clock. The digital interpolator supplies the phases using a double clocked shift register with recirculating feedback. The shift register is double clocked using the 2.5 GHz clock.

The register outputs are tapped and fed to a 32:1 multiplexer having a phase select input that is controlled by the phase difference signal generated by the DLL. The phase difference control signal is converted to a digital representation of its magnitude by which the requisite number of phase shift increments may be selected. The phase chosen is that which eliminates any difference in the phases of the 156 MHz clock that clocks the data transmitted to the ASIC domain and the clock that is used in the ASIC domain to latch the data. Thus, the interpolator takes advantage of the availability of the high-speed clock to generate a sufficient number of phases for a low speed DLL.

Other features and advantages of the present invention will become apparent from the following detailed description of the invention made with reference to the accompanying drawings.

BRIEF DESCRIPTION OF THE SEVERAL VIEWS OF THE DRAWINGS

The aspects and advantages of the present invention will be more fully understood when considered with respect to the following detailed description, appended claims and accompanying drawings wherein:

DETAILED DESCRIPTION OF THE INVENTION

Figure 1:
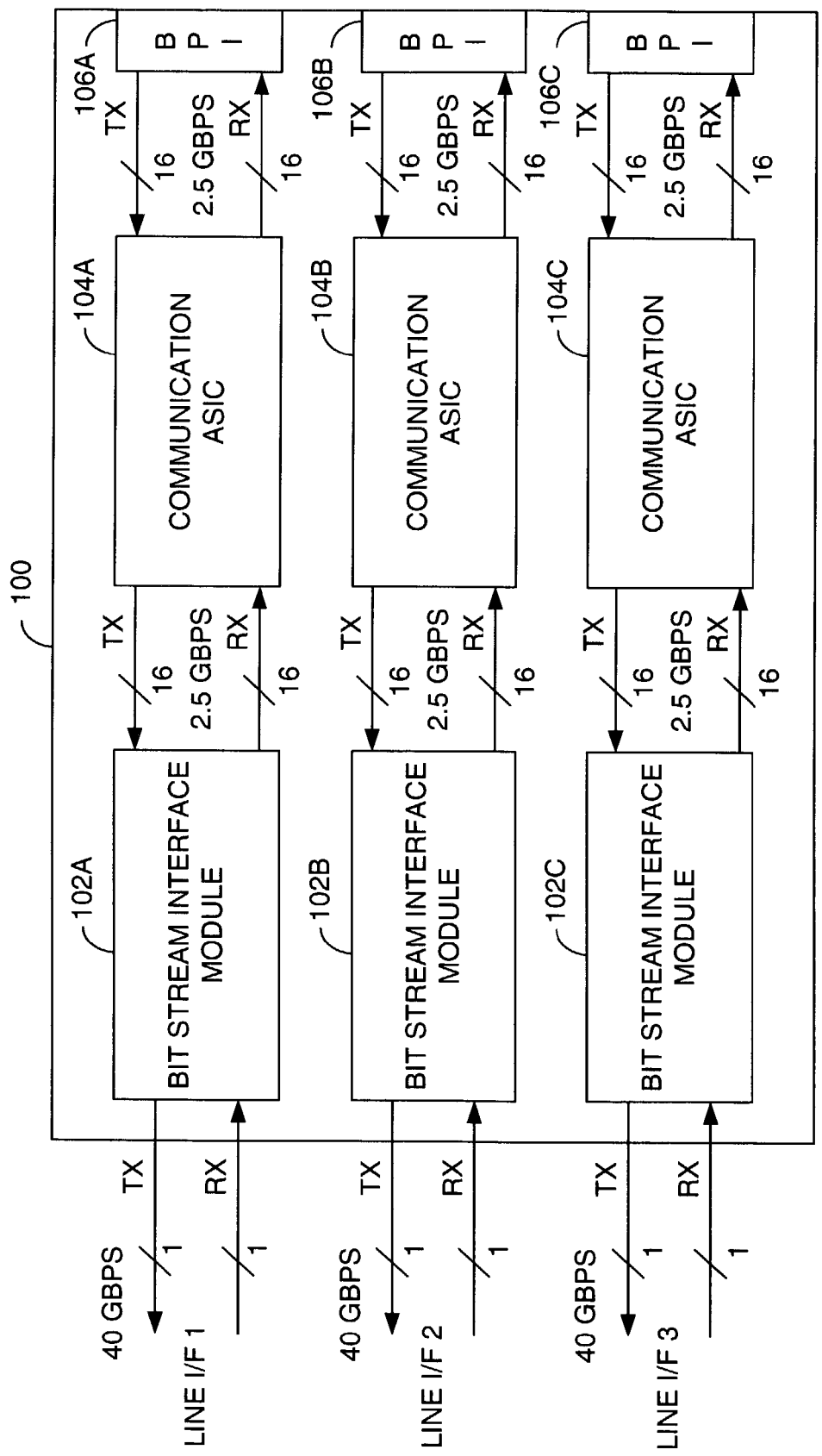
FIG. 1 is a block diagram illustrating a Printed Circuit Board (PCB) that has mounted thereon a plurality of Bit Stream Interface Module (BSIMs) constructed according to the present invention.

FIG. 1 is a block diagram illustrating a Printed Circuit Board (PCB) that has mounted thereon a plurality of Bit Stream Interface Module (BSIMs) constructed according to the present invention. As shown in FIG. 1, the PCB 100 includes BSIMs 102A, 102B and 102C. The PCB 100 also includes mounted thereupon communication Application Specific Integrated Circuits (ASIC) 104A, 104B, and 104C. The PCB 100 is mounted within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported. Communication ASIC 104A through 104C may communicate with other PCB components located in the housing via back interfaces 106A through 106C.

The BSIMs 102A through 102C may be removably mounted upon the PCB 100. In such case, if one of the BSIMs 102A through 102C fails it may be removed and replaced without disrupting operation of other devices on the PCB 100. When the BSIMs 102–102C are removably mounted upon the PCB 100, they are received by a socket or connection coupled to the PCB 100. Further, in such embodiment, the BSIMs 102A–102C may be constructed on a separate PCB.

Figure 2A:
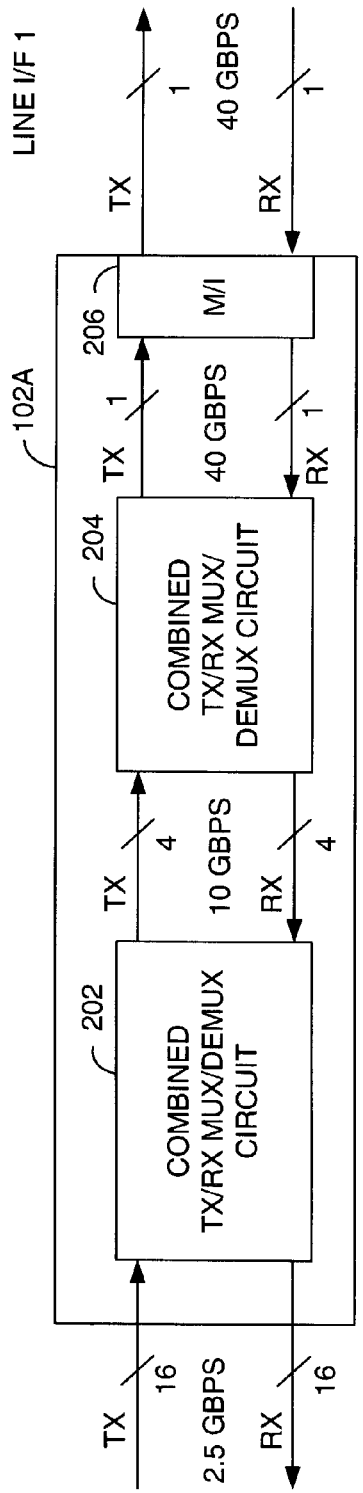
FIG. 2A is a block diagram illustrating one embodiment of a BSIM constructed according to the present invention.

FIG. 2A is a block diagram illustrating one embodiment of a BSIM 102A constructed according to the present invention. The BSIM 102A of FIG. 2A includes a first combined TX/RX multiplexer/demultiplexer circuit 202 and a second combined TX/RX multiplexer/demultiplexer circuit 204. On the line side of the BSIM 102A, the first combined TX/RX multiplexer/demultiplexer circuit 202 couples to a media, e.g., fiber optic cable or copper cable, via a media interface 206. The media interface 206 couples to the combined TX/RX multiplexer/demultiplexer circuit 204 via a 40 GPS nominal bit rate, one bit transmit and one bit receive interface. The TX and RX line medias themselves each support one bit 40 Giga bits-per-second (GBPS) nominal bit rate communications, such as is defined by the OC-768 and/or SEC 768 specifications of the OIF.

The combined TX/RX multiplexer/demultiplexer circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16*2.5 GBPS). The interface between the combined TX/RX multiplexer/demultiplexer circuit 202 and the combined TX/RX multiplexer/demultiplexer circuit 204 includes 4 TX bit lines and 4 RX bit lines, each operating at a nominal rate of 10 GBPS. This interface supports a nominal total throughput of 40 GBPS (4*10 GBPS). This interface may operate substantially or fully in accordance with an operating standard known as the Q40 operating standard. However, the teachings of the present invention are neither limited according to operation of the Q40 standard, nor is the description here intended to be a complete description of the Q40 standard itself.

Figure 2B:
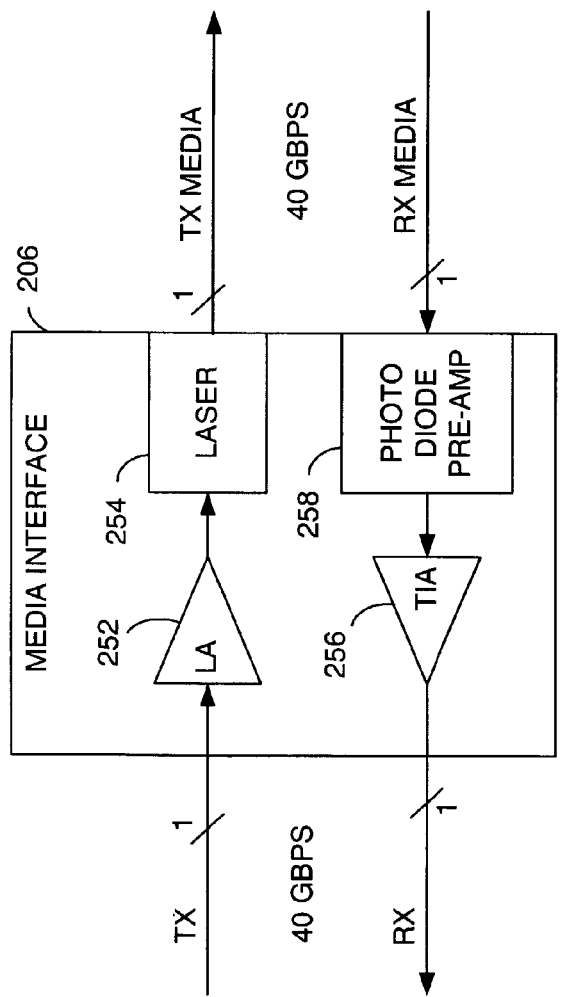
FIG. 2B is a block diagram illustrating an optical media interface that may be included with the BSIM of FIG. 2A.

FIG. 2B is a block diagram illustrating an optical media interface that may be included with the BSIM of FIG. 2A. As shown in FIG. 2B, media interface 206 couples to an optical media on a first side and couples to the combined TX/RX multiplexer/demultiplexer circuit 204 on a second side. In the transmit path, the media interface 206 receives a single bit stream at a nominal bit rate of 40 GBPS from the combined TX/RX multiplexer/demultiplexer circuit 204. The TX bit stream is amplified by limiting amplifier 252 to produce a bit stream output that is coupled to laser 254. The laser produces an optical signal that is coupled to TX optical media.

On the receive side, an RX optical media produces the RX bit stream at a nominal bit rate of 40 GBPS. The RX bit stream is received by a photo diode/pre-amplifier combination 258. The photo diode/pre-amplifier combination 258 produces an output that is received by a transimpedance amplifier 256. The output of the transimpedance amplifier 256 is a single bit stream at a nominal bit rate of 40 GBPS that is provided to the combined TX/RX multiplexer/demultiplexer circuit 204 of FIG. 2A.

Figure 3:
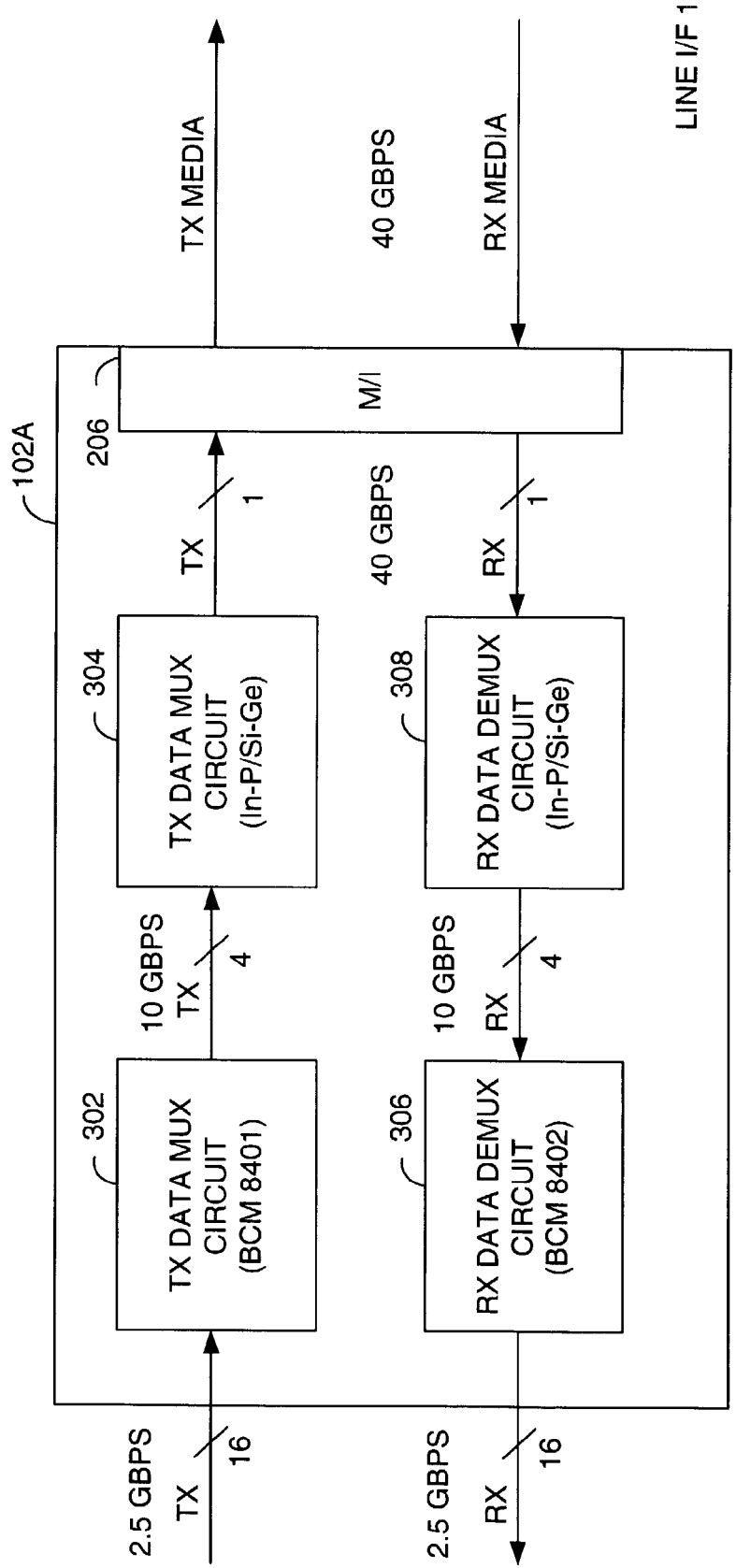
FIG. 3 is a block diagram illustrating another embodiment of a BSIM constructed in two stages, each of which is built on a separate chip using different process technology in accordance with the invention.

FIG. 3 is a block diagram illustrating another embodiment of a BSIM constructed according to the present invention. The embodiment of FIG. 3 differs from the embodiment of FIG. 2A in that separate TX and RX circuit components are employed. While the media interface 206 of FIG. 3 is shown to be a single device such as shown in FIG. 2B, in other embodiments, the media interface 206 may be formed in separate circuits corresponding to the separate TX and RX paths shown in FIG. 2B.

In the TX path, TX data multiplexer circuit 302 receives a 16 bit wide by 2.5 GBPS nominal bit rate input from a coupled ASIC and produces a 4 bit wide×10 GBPS nominal bit rate TX output. In the embodiment described herein, the TX data multiplexer circuit 302 is constructed in a Silicon CMOS process, for example in a 0.13 micron CMOS process. The TX data multiplexer circuit 302 multiplexes the 16 bit wide by 2.5 GBPS nominal bit rate input to produce a 4 bit wide 10 GBPS nominal bit rate output, which is received by the TX data multiplexer circuit 304. The TX data multiplexer circuit 304 multiplexes the 4 bit wide×10 GBPS nominal bit rate output to produce a single bit wide output at a nominal bit rate of 40 GBPS.

The TX data multiplexer circuit 304 must switch at a frequency that is at least four times the rate at which the TX data multiplexer circuit 302 must switch. For this reason, the TX data multiplexer circuit 304 is constructed in an Indium-Phosphate process or in a Silicon-Germanium process. Each of these processes supports the higher switching rates required at the 40 GBPS output of the TX data multiplexer circuit 304. Thus in combination the TX data multiplexer circuit 302 constructed in a CMOS process and the TX data multiplexer circuit 304 constructed in an Indium-Phosphate or Silicon-Germanium process will provide a high performance relatively low cost solution to the interfacing of a 2.5 GBPS nominal bit rate 16 bit wide interface and a 40 GBPS 1 bit wide interface.

Likewise, in the RX path, the bit stream interface module 102A includes an RX data demultiplexer circuit 308 that receives a single bit stream at a nominal bit rate of 40 GBPS data. The RX data demultiplexer circuit 308 produces a 4 bit wide×10 GBPS nominal bit rate output. The RX data demultiplexer circuit 306 receives the 4 bit wide×10 GBPS nominal bit rate output and produces a 16 bit wide×2.5 GBPS nominal bit rate receive data stream.

As was the case with the TX data multiplexer circuit 302 and the TX data multiplexer circuit 304, the RX data demultiplexer circuit 306 and the RX data demultiplexer circuit 308 are formed in differing process types. In particular the RX data demultiplexer circuit 306 is constructed in a Silicon CMOS process. Further, the RX data demultiplexer circuit 308 is constructed in an Indium-Phosphate or Silicon-Germanium process so that the RX demultiplexer circuit 308 will support the higher switching speeds of the 1 bit wide×40 GBPS interface to the media interface 206.

Figure 4A:
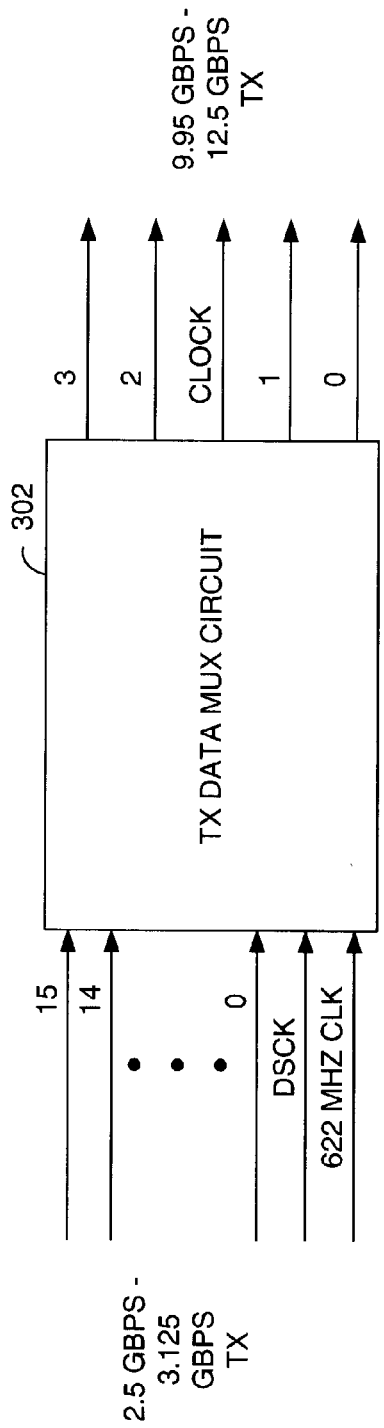
FIG. 4A is a block diagram illustrating a first embodiment of the TX data multiplexer circuit of the BSIM of FIG. 3 constructed as chip independent from the ASIC in accordance with the present invention.

As shown in FIG. 4A, the TX data multiplexer circuit 302 receives 16 bit steams of data at nominal bit rate of 2.5 GBPS on each bit line from the communication ASIC 104A (FIG. 1). Each bit line of this 16 bit wide interface however can operate at bit rates of up to 3.125 GBPS. This interface also includes a DSCK clock and 622 MHz clock. The output of the TX data multiplexer circuit 302 includes 4 bit lines, each of which supports a nominal bit rate of 10 GBPS. However, the output of the TX data multiplexer circuit can produce data at bit rates of between 9.95 GBPS and 12.5 GBPS. The TX data multiplexer circuit 302 also produces a clock signal at one-half the nominal bit rate of the 4 bit stream paths. In such case, when the nominal bit rate of the data paths is 10 GBPS, the clock will be produced at 5 GHz.

Figure 4B:
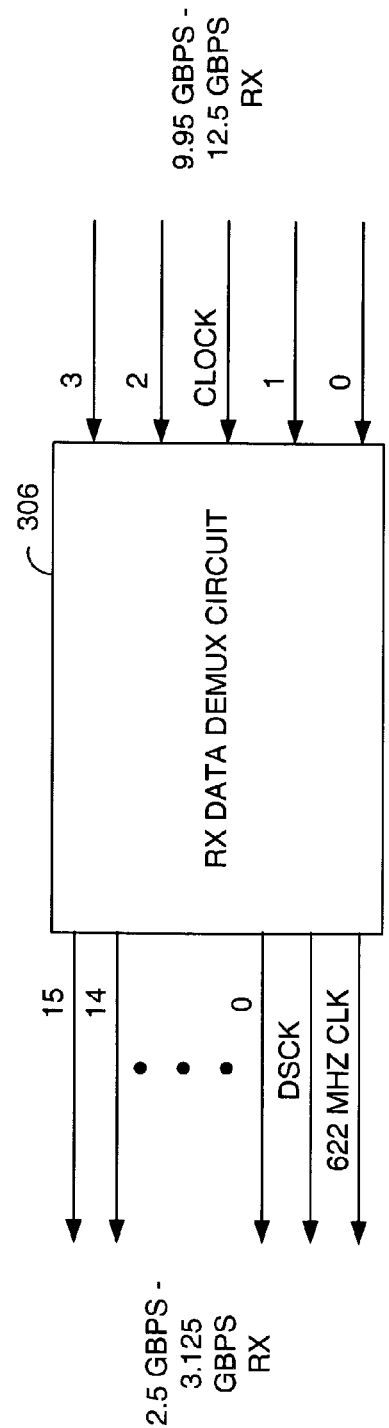
FIG. 4B is a block diagram illustrating a first embodiment of the RX data demultiplexer circuit of the BSIM of FIG. 3 constructed as chip independent from the ASIC in accordance with the present invention.

FIG. 4B is a block diagram illustrating an RX data demultiplexer circuit 306 constructed according to the present invention. As shown in FIG. 4B, the RX data demultiplexer circuit 306 receives 4 bit streams at nominal bit rates of 10 GBPS each but may operate in the range of 9.95 GBPS to 12.5 GBPS. The RX data demultiplexer circuit 306 produces 16 bit stream outputs to the communications ASIC of FIG. 1 at a nominal bit rate of 2.25 GBPS. However, the RX data demultiplexer circuit 306 may produce the 16 bit streams output at a bit rate of between 2.5 GBPS and 3.125 GBPS.

The TX multiplexer and RX demultiplexer circuits of FIGS. 4A and 4B are typically coupled to the ASIC (104 A–C, FIG. 1) over the 16 bit streams using some standard protocol such as SPI-5. The ASIC performs certain data processing functions such as framing or forward error correction (FEC).

Figure 5:
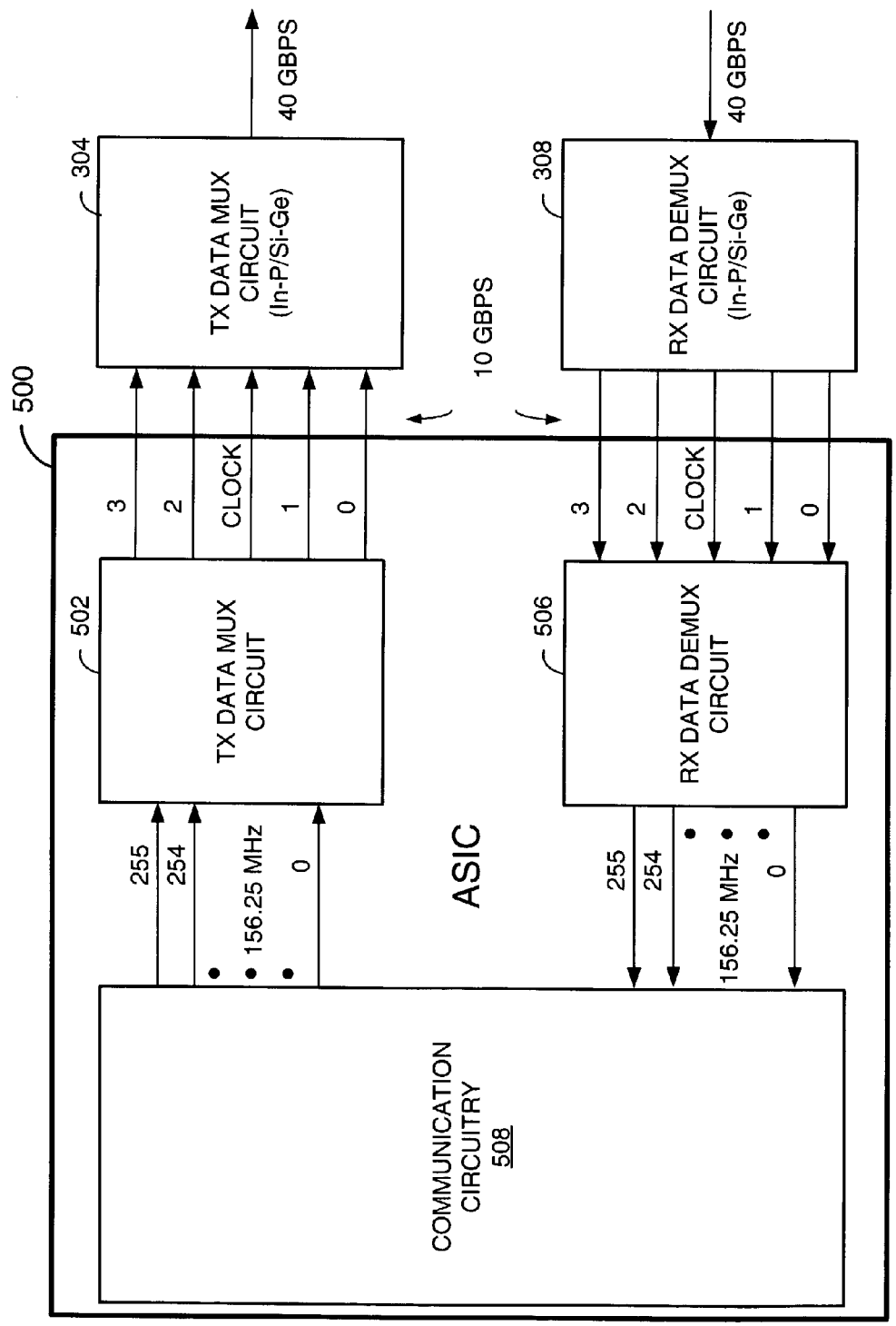
FIG. 5 is a block diagram illustrating second embodiments of the TX data multiplexer and the RX demultiplexer circuits of the BSIM of FIG. 3 constructed as part of an ASIC on the same chip in accordance with the present invention.

FIG. 5 is a block diagram illustrating an ASIC 500 that includes a TX data multiplexer circuit 502, a RX data demultiplexer circuit 506, and communication circuitry 508 that are constructed as a single piece of silicon in accordance with the present invention. In one embodiment, the ASIC 500 is made from the same standard CMOS process as previously mentioned with respect to the TX data multiplexer circuit 302 and RX data demultiplexer circuit 306.

The TX data multiplexer circuit 502 communicates with the now physically proximate communication circuitry 508 using a much slower bit-line interface to receive data from the communication circuitry 508 at 256 bit streams wide by 156.25 MBPS. Note that this still yields the total system throughput of 40 GBPS received from the other side. Further note that the 156.25 MBPS rate is referred to as one example and such example may be referred to otherwise herein as 156 MBPS, 160 MBPS, or otherwise, without departing from the present invention. Likewise, RX data demultiplexer circuit 506 outputs data locally to the communication circuitry 508 over a slower and wider output having 256 bit streams, each operating at 156.25 MBPS.

One of the difficulties that must be overcome is that the RX data multiplexer circuit 506 is clocked internally at the rate of 2.5 GHz, which is very fast compared to the 156.25 MBPS data rate of the communication circuitry 508 and other components that the ASIC 500 may include (not shown). Thus, 2.5 GHz clocked used within the RX data demultiplexer circuitry 506 to transfer the data to the communication circuitry 508 is significantly faster than the 156.25 MHz clock that is used to latch the data by the communication circuitry 504. Thus, the two clocks must be kept locked to be sure that data sent to by the RX data demultiplexer circuit 506 to the communication circuitry 504 is properly latched notwithstanding the delay that the clock signal may experience across the ASIC 500 and through the communication circuitry 508 to the latch that must capture the data on behalf of the communication circuitry 504.

Figure 6:
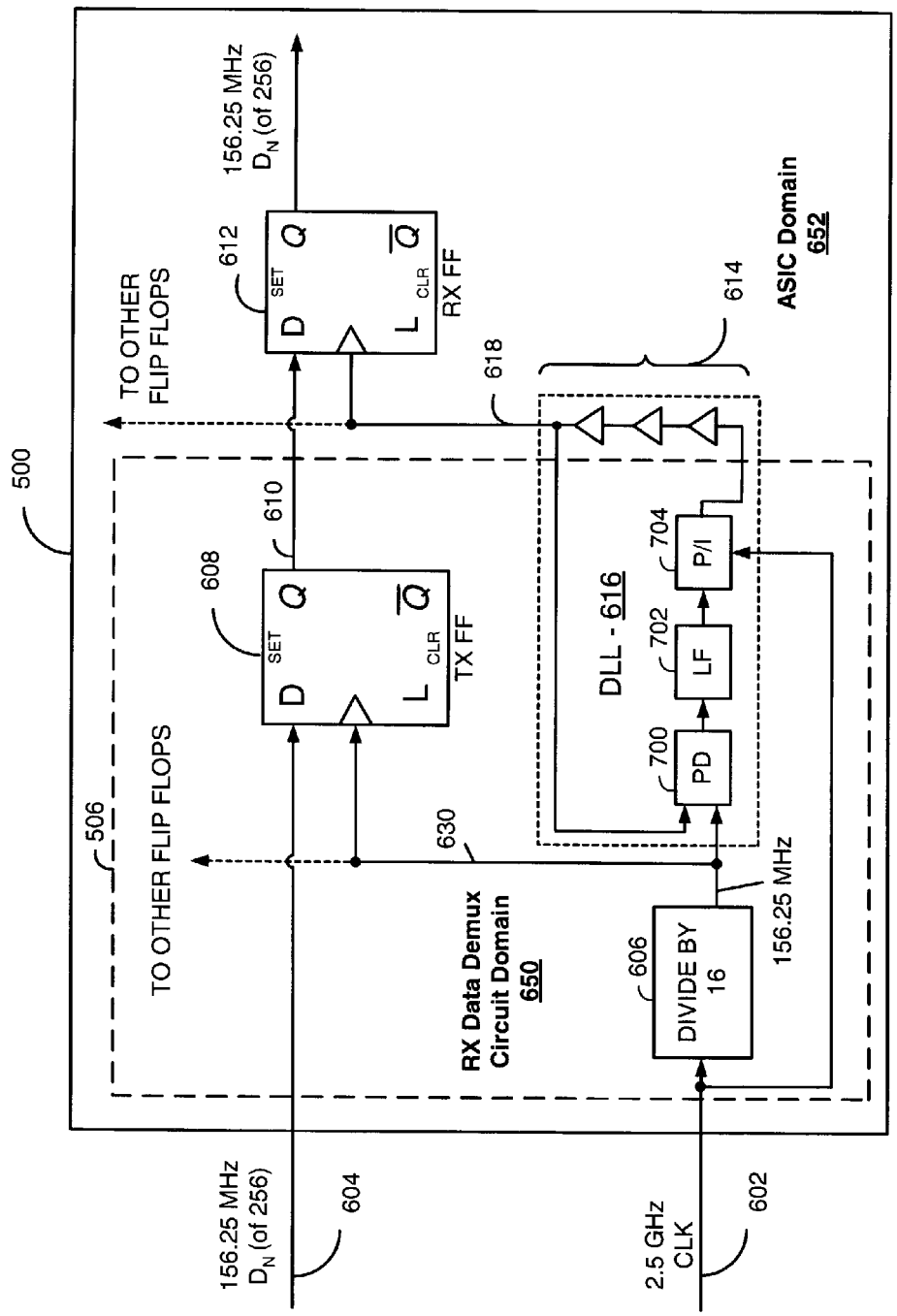
FIG. 6 is a circuit block diagram of an embodiment of an interface between the RX data demultiplexer of FIG. 4 and the ASIC circuitry having a DLL in accordance with the present invention.

FIG. 6 illustrates an isolated view of a portion of the interface between the RX data demultiplexer circuit 506 of FIG. 5 and the communication circuitry 508 within the ASIC 500 that both are integrated. The interface involves a considerably slower clock rate than the 2.5 GPBS previously used to communicate with SFI-5 ASIC circuits integrated independently from the demultiplexer. A 156.25 MHz clock 630 must be generated by circuit 506 for it to operate using this interface.

The RX data demultiplexer circuit 506 divides the 2.5 GHz clock by 16 through divide-by-16 circuit 606 to achieve the 156.25 MHz clock by which data is to be transferred to the communication circuitry 504 circuitry in the ASIC domain 652. The 156.25 MHz clock is fed into the TX flip-flop 608 through which data from the RX data demultiplexer circuit 506 is transmitted and latched into to the RX flip-flop 612 in the ASIC domain 652 of the communication circuitry 508. While a single TX flip-flop 608 and a single RX flip-flop 612 are shown, some or all of the 256 TX flip-flops and the 256 flip-flops may be clocked by the clocks shown in FIG. 6. Alternately, multiple clocks may be generated, each of which clocks one or more TX flip-flop and/or one or more RX flip-flops.

Propagation delays can cause skew between the clock 630 used to clock the TX flip-flop 608 for the RX data demultiplexer circuit 506, and the clock 618 used to clock the latch 612 employed to capture the data in the communication circuitry 508 in the ASIC domain 652. Because this delay can vary significantly as a function of the processing parameters as well as the specific circuit design from one ASIC to another, a delay locked loop (DLL) 616 is interposed between clock 630 and clock 618 to compensate for the delay represented by delay elements 614. While the delay elements 614 are shown to be discrete buffers, such representation is illustrative only. The delay represented by these delay elements 614 is caused by trace lengths and other actual circuit characteristics of the ASIC 500.

Thus, the clock edges of clock 630 and clock 618 are locked by the DLL 616 to ensure that clock edge 618 arrives at the RX flip-flop 612 soon after data is presented by the TX flip-flop 608. With this substantial synchronization achieved, the likelihood of lost data is diminished. The DLL 616 accomplishes this by phase comparing the two clocks 630 and 618 and by eliminating the error between them by choosing one of many available phases of the clock 602. The DLL 616 typically chooses a phase that will advance the clock edge 618 such that after the delay, it will be arriving slightly after the arrival of data from the TX flip-flop 608.

Figure 7:
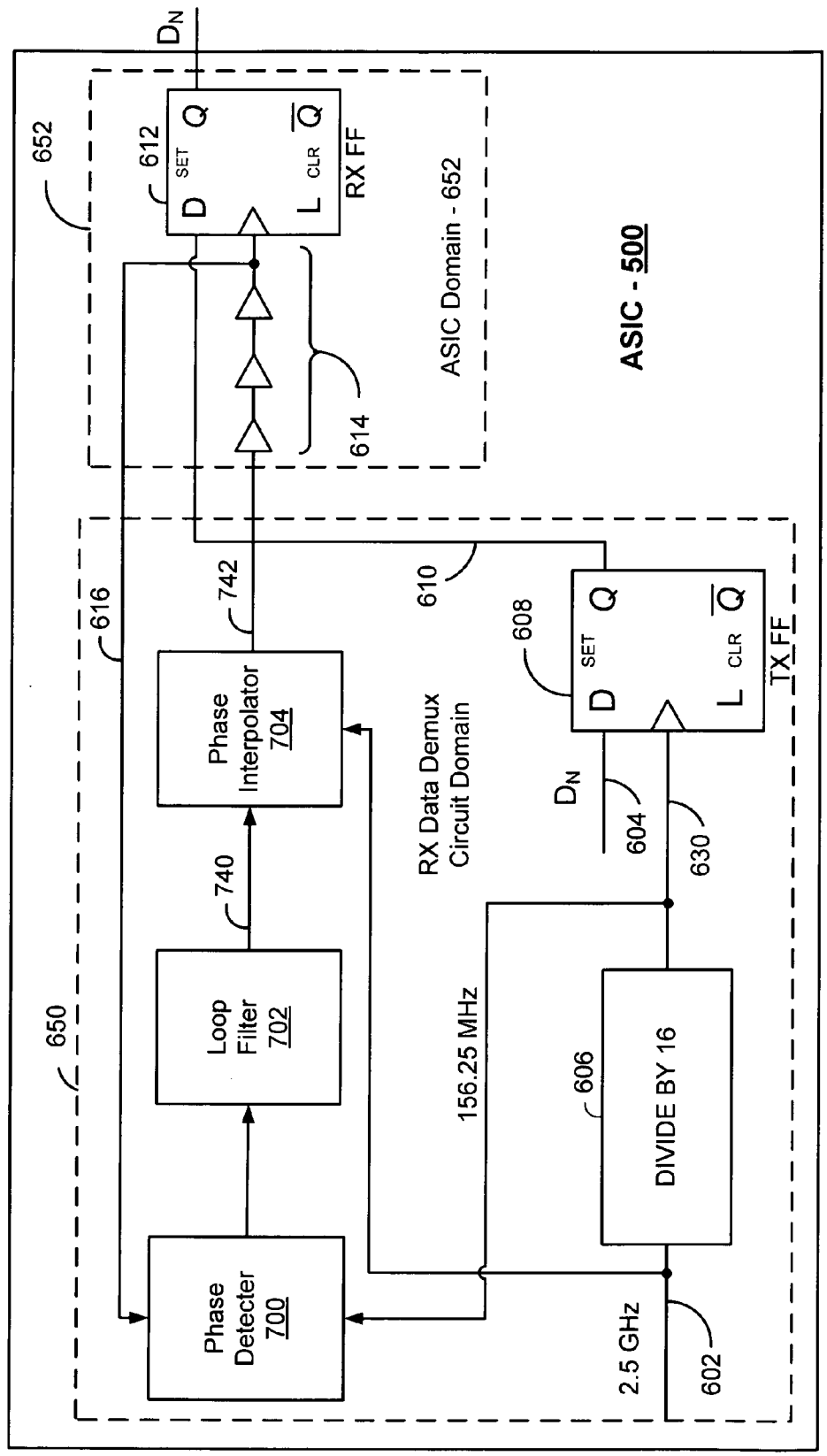
FIG. 7 is a block diagram illustrating the DLL of FIG. 5 having an interpolator in accordance with the invention.

FIG. 7 illustrates one embodiment of a low-speed DLL that may be used in conjunction with the present invention. Phase detector 700 compares the 156.25 MHz clock 630 with the clock 616 to determine any phase difference between the edges of the clocks. A phase difference signal is produced as a control voltage that is fed into loop filter 702. The loop filter 702 filters the input received from the phase detector 700 and creates a control signal 740 that is received as an input by the phase interpolator 704. The control signal 740 is a signal that is proportional to the magnitude of the phase difference between the two clocks 630 and 616. The interpolator 704 uses the control signal 740 to select a phase that is sufficient to adjust for the difference. This phase adjustment is applied to its own internally-generated version of the 156.25 MHz clock 630 derived from the 2.5 GHz clock 602 and the resulting new phase adjusted 156.25 MHz clock 742 is provided to the delay elements 614. The output of the delay elements 614 is provided as the clock to the RX flip-flop 612.

An input stream of data DN 604 is received by the TX flip-flop 608, which is latched into the TX flip-flop 608 by clock 630. Soon after latching the data DN 604, the data is ready to be latched into the RX flip-flop 612 by clock 616. Soon after latching by clock 616, the data DN is ready for reading by the communication circuitry 508 that operates in the ASIC domain 652.

Figure 8:
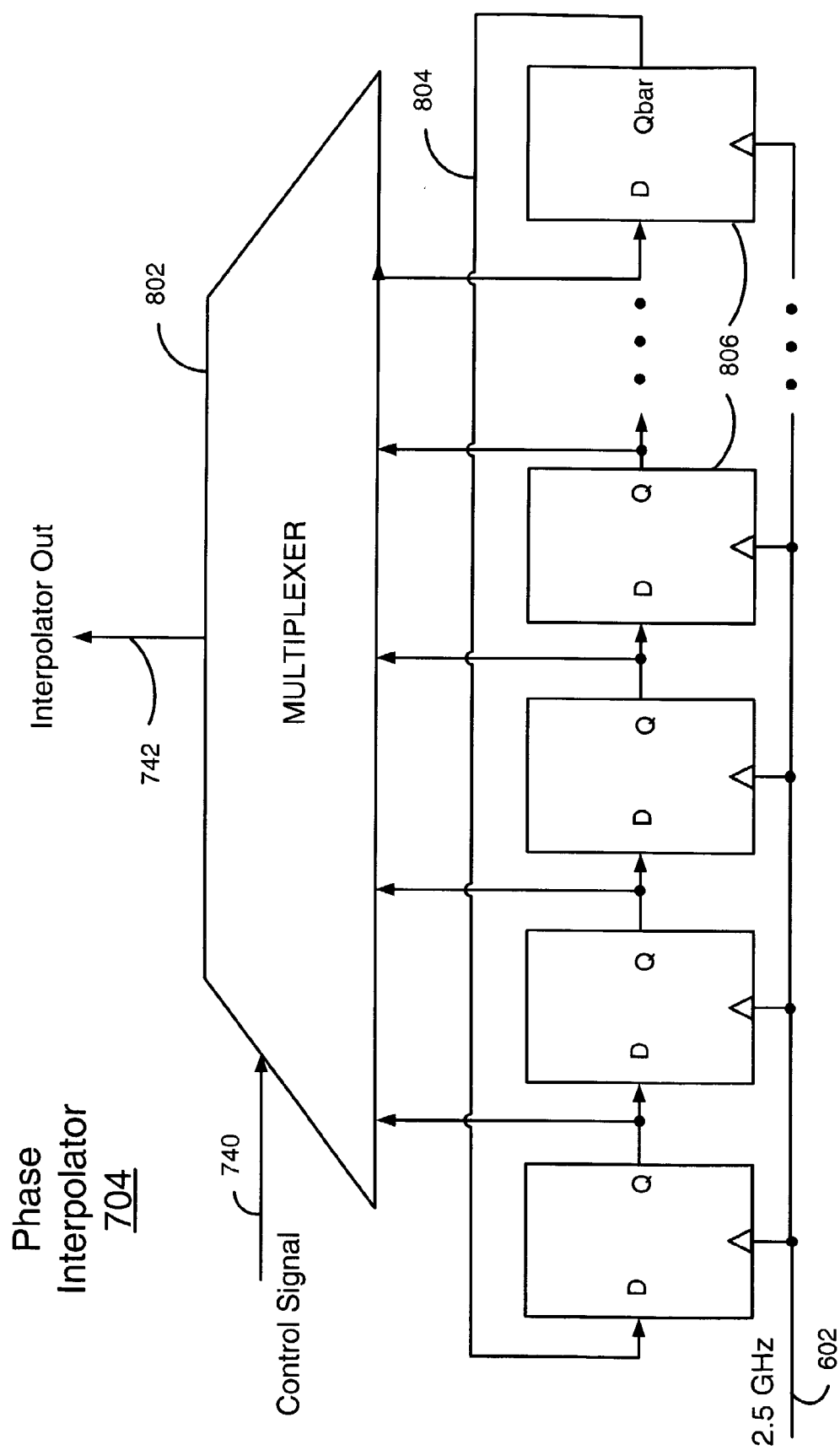
FIG. 8 is a circuit block diagram of an embodiment of the interpolator of the invention.

FIG. 8 illustrates a phase interpolator 704 of a DLL constructed according to the present invention. The 2.5 GHz clock 602 is fed into the clock inputs of a shift register made up of 32 registers 806, e.g., flip-flops. The registers 806 are sensitive to both edges of the clock, so that 32 phases of the 156.25 MHz clock are generated. The feedback line 804 provides a recirculating binary one and zero to produce the entire cycle of each phase of the slower clock. As previously described, the control signal 740 is based on the phase difference signal from the loop filter 702 of the DLL of FIG. 7. If the control signal 740 is an analog signal, it may be converted to a digital signal that chooses the correct number of phase increments and therefore the total requisite phase shift of the 156.25 MHz clock that will compensate for the phase difference between clocks 602 and 616.

In essence, the interpolator of the invention takes advantage of a very high frequency clock that is available and from which the slower clock was derived, and uses it to generate a number of phases of the slower clock without need for complex, power hungry analog solutions.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method of coupling one or more outputs of a first circuit to one or more inputs of a second circuit, the core of the first circuit operating at a first clock frequency, the second circuit operating at a second clock frequency, the first clock frequency substantially higher than the second clock frequency, said method comprising:
   generating a first clock operating at the second clock frequency based on a clock running at the first clock frequency;
   transmitting data from the first circuit to a latch of the second circuit using an edge of the first clock operating at the second clock frequency;
   latching the transmitted data at the second circuit using an edge of a second clock operating at the second clock frequency; and
   adjusting a phase of the second clock to substantially match a phase of the first clock at a point where the second clock reaches a clock input of the latch, said adjusting further includes:
      generating a plurality of versions of the second clock using the clock operating at the first clock frequency by clocking a binary one through a recirculating shift register using both edges of the first clock running at the first clock frequency, each of the versions having an incremental phase difference equal to one half the period of the first clock frequency, wherein the recirculating shift register includes a number of flip-flops equal to twice the number by which the first clock frequency is divided to obtain the second clock frequency; and
      selecting the version of the second clock having the phase that produces the match.

2. The method of claim 1 wherein said selecting further comprises:
   comparing the phase of the first clock operating at the second clock frequency with the phase of a version of the second clock operating at the second clock frequency as it arrives at the clock input of the latch of the second circuit to determine a phase error signal; and
   outputting a version of the second clock to the second circuit based on the magnitude of the phase error that will arrive at the clock input of the latch substantially in phase with the first clock as it transmits data from the first circuit.

3. The method of claim 2 wherein said outputting further comprises multiplexing the plurality of versions of the second clock using the phase error signal.

4. The method of claim 3 wherein said first clock frequency is about 2.5 GHz, the second clock frequency is about 156 MHz and the recirculating shift register comprises thirty-two flip-flops.

5. The method of claim 3 wherein the first clock frequency is divided by an integer $2^n$ to achieve the second clock frequency, the recirculating shift register comprises $2(2^n)$ flip-flops and the plurality of versions of the second clock equals $2(2^n)$.

6. An apparatus for coupling one or more outputs of a first circuit to one or more inputs of a second circuit, the core of the first circuit operating at a first clock frequency, the second circuit operating at a second clock frequency, the first clock frequency substantially higher than the second clock frequency, said apparatus comprising:
   means for generating a first clock operating at the second clock frequency based on a clock running at the first clock frequency;
   means for transmitting data from the first circuit to the second circuit using an edge of the first clock operating at the second clock frequency;
   means for latching the transmitted data at the second circuit using an edge of a second clock operating at the second clock frequency; and
   means for adjusting the phase of the second clock to substantially match the phase of the first clock at a point where the second clock reaches a clock input of the latch, said means for adjusting further includes:
      means for generating a plurality of versions of the second clock using the clock operating at the first clock frequency, each of the versions having an incremental phase difference equal to one half the period of the first clock frequency, wherein said means for generating a plurality of versions further includes means for clocking a binary one through a recirculating shift register using both edges of the clock operating at the first clock frequency, wherein the recirculating shift register includes a number of flip-flops equal to twice the number by which the first clock frequency is divided to obtain the second clock frequency; and
      means for selecting the version of the second clock having the phase that produces the match.

7. The apparatus of claim 6 wherein said means for selecting further comprises:
   means for comparing the phase of the first clock operating at the second clock frequency with the phase of a version of the second clock operating at the second clock frequency as it arrives at the clock input of the latch of the second circuit to determine a phase error signal; and
   means for outputting a version of the second clock to the second circuit based on the magnitude of the phase error that will arrive at the clock input of the latch substantially in phase with the first clock as it transmits data from the first circuit.

8. The apparatus of claim 7 wherein said means for outputting further comprises means for multiplexing the plurality of versions of the second clock using the phase error signal.

9. The apparatus of claim 8 wherein said first clock frequency is about 2.5 GHz, the second clock frequency is about 156 MHz and the recirculating shift register comprises thirty-two flip-flops.

10. The apparatus of claim 8 wherein the first clock frequency is divided by an integer $2^n$ to achieve the second clock frequency, the recirculating shift register comprises $2(2^n)$ flip-flops and the plurality of versions of the second clock equals $2(2^n)$.

11. An interface circuit for coupling one or more outputs of a first circuit to one or more inputs of a second circuit, the core of the first circuit operating at a first clock frequency, the second circuit operating at a second clock frequency, the first clock frequency substantially higher than the second clock frequency, said interface circuit comprising:
   a frequency divider having an input coupled to the first circuit and producing an output that is a first low-speed clock having a frequency equal to the second clock frequency;
   a first latch having an input for receiving data to be transmitted to the second circuit and a clock input for receiving the first low-speed clock by which to latch the data to a Q output of the latch for propagation to the second circuit;

a second latch residing in the second circuit having a data input coupled to the Q output of the first latch for receiving the transmitted data and a clock input for receiving a second low speed clock operating at the second clock frequency and by which the data is latched into the second circuit;

a delay locked loop (DLL) for adjusting the phase of the second clock frequency to substantially match the phase of the first clock frequency at a point where the second clock frequency reaches the clock input of the second latch, said DLL further includes:

a phase interpolator for generating a plurality of versions of the second clock frequency using the clock operating at the first clock frequency, each of the versions having an incremental phase difference equal to one half the period of the first clock frequency; and selecting the version of the second clock frequency having the phase that produces the match.

12. The interface circuit of claim 11 wherein said phase interpolator further comprises:

a shift register comprising a plurality of flip-flops each having a Q output and a data input, the plurality of flip-flops coupled in series with the Q output of each shift register coupled to the data input of a next flip-flop in the series, the Q output of a last flip flop in the series being coupled to the data input of a first of the flip-flops in the series;

a multiplexer having a plurality of inputs coupled to receive the plurality of Q outputs of the flip-flops, and having an output that produces one of the inputs based on a k-bit select input, where k is an integer and the plurality of inputs is equal to $2^k$; and wherein the plurality of flip-flops is clocked by a high speed clock having a first clock frequency to produce a plurality of phases of a first low-speed clock having a second clock frequency that is substantially lower than the first clock frequency.

13. The interface circuit of claim 12 wherein:

the high speed clock is divided down by 2" to produce a second low-speed clock at the second clock frequency;

the flip-flops are sensitive to both edges of the first high-speed clock; and the shift register comprises 2(2") flip-flops producing 2(2") phases of the first low-speed clock.

* * * * *